US010659025B2

(12) United States Patent
Fronczak et al.

(10) Patent No.: US 10,659,025 B2
(45) Date of Patent: May 19, 2020

(54) ADAPTIVE BIAS CIRCUIT FOR POWER EVENT DETECTION COMPARATOR

(71) Applicant: Synaptics Incorporated, San Jose, CA (US)

(72) Inventors: Kevin Fronczak, Penfield, NY (US); Mark Pude, Honeoye Falls, NY (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/378,853

(22) Filed: Apr. 9, 2019

(65) Prior Publication Data

US 2019/0326895 A1 Oct. 24, 2019

Related U.S. Application Data

(60) Provisional application No. 62/660,679, filed on Apr. 20, 2018.

(51) Int. Cl.
*H03K 5/24* (2006.01)
*H03K 17/687* (2006.01)
*G06K 9/00* (2006.01)
*G06F 3/044* (2006.01)

(52) U.S. Cl.
CPC .............. *H03K 5/24* (2013.01); *H03K 17/687* (2013.01); *G06F 3/044* (2013.01); *G06K 9/0002* (2013.01); *G06K 9/00026* (2013.01)

(58) Field of Classification Search
CPC ...... H03K 5/24; H03K 5/2472; H03K 5/2481; H03K 17/687; G06F 3/044; G06K 9/0002; G06K 9/00026
USPC ................................................... 327/142, 143
See application file for complete search history.

(56) References Cited

U.S. PATENT DOCUMENTS

2004/0027169 A1* 2/2004 Eberlein ................... H03F 3/45
327/66
2016/0026203 A1* 1/2016 Trauth ....................... G05F 3/02
327/77

* cited by examiner

*Primary Examiner* — Tomi Skibinski
(74) *Attorney, Agent, or Firm* — Leydig, Voit & Mayer, Ltd.

(57) ABSTRACT

A system includes: a power supply; an adaptively biased power event detection comparator; and an adaptive bias circuit for the adaptively biased power event detection comparator. The adaptively biased power event detection comparator is configured to compare a first input corresponding to a voltage level of the power supply with a second input corresponding to a reference voltage. The adaptive bias circuit is configured to increase a bias current for the adaptively biased power event detection comparator based on the voltage level of the power supply decreasing to be closer to the reference voltage.

16 Claims, 8 Drawing Sheets

ADAPTIVE BIAS CIRCUIT FOR POWER EVENT DETECTION COMPARATOR

CROSS-REFERENCE TO RELATED APPLICATION

This patent application claims the benefit of U.S. Provisional Patent Application No. 62/660,679, filed Apr. 20, 2018, which is incorporated herein by reference in its entirety.

BACKGROUND

Input devices are widely used in a variety of electronic systems. Input devices include touch sensor devices (also commonly called touchpads or proximity sensor devices) and fingerprint sensor devices. Touch sensor devices typically include a sensing region in which the touch sensor device determines the presence, location and/or motion of one or more input objects, typically for purposes of allowing a user to provide user input to interact with the electronic system. Fingerprint sensor devices also typically include a sensing region in which the fingerprint sensor device determines presence, location, motion, and/or features of a fingerprint or partial fingerprint, typically for purposes relating to user authentication or identification of a user. The sensing region of a touch sensor device or a fingerprint sensor device may be demarked by a surface.

Touch sensor devices and fingerprint sensor devices may thus be used to provide interfaces for an electronic system. Examples of touch sensor devices and fingerprint sensor devices include opaque touchpads and fingerprint readers integrated in or peripheral to laptop or desktop computers. Other examples of touch sensor devices and fingerprint sensor devices include touch screens integrated in mobile devices such as smartphones and tablets.

Touch sensor devices and fingerprint sensor devices, as well as other types of devices, may include "always on" idle states in which the device consumes low power relative to a higher power state in which the device is performing some operation. An example of an "always on" idle state is a wake-on-event (WOE) state. An example of a relatively higher power state is a touch sensor device or a fingerprint sensor device performing imaging. In the "always on" idle state, power is supplied to the device, and if there is a power event such as a glitch or malfunction in which the voltage provided by the power supply falls too low, problems such as memory corruption may occur.

Conventionally, bandgap voltage comparators may be used to detect a low voltage event. A status signal provided by the bandgap voltage comparator can indicate whether or not a power supply is in an operational state or whether it is too low. For example, a high value of the status signal can correspond to a power status "good" state, and a low value of the status signal can correspond to a power status "bad" state. The bandgap voltage comparator may, for example, be part of a power-on-reset (POR) circuit. When there is a transition from the operational state to a low power state which may cause a component of the device to malfunction, the output of the bandgap voltage comparator can be used to respond to the situation and avoid the malfunction. For example, the output of the bandgap voltage comparator indicating a "bad" power status can trigger a response to avoid a problem such as a chip malfunction. In another situation, when there is a transition from a low power state to an operational state, the output of the bandgap voltage comparator indicating a "good" power status can be used to safely enable one or more components of the device.

However, bandgap voltage comparators have the disadvantage of requiring a relatively large bias current, which can result in a significant amount of cumulative power consumption during an "always on" idle state.

SUMMARY

In an exemplary embodiment, the present disclosure provides a system. The system includes: a power supply; an adaptively biased power event detection comparator; and an adaptive bias circuit for the adaptively biased power event detection comparator. The adaptively biased power event detection comparator is configured to compare a first input corresponding to a voltage level of the power supply with a second input corresponding to a reference voltage. The adaptive bias circuit is configured to increase a bias current for the adaptively biased power event detection comparator based on the voltage level of the power supply decreasing to be closer to the reference voltage.

In another exemplary embodiment, the present disclosure provides an adaptive bias circuit for an adaptively biased power event detection comparator. The adaptive bias circuit includes: a first input corresponding to a voltage level of a power supply; a second input corresponding to a reference voltage; a current source, configured to generate current at a first level; an output configured to provide a bias current for the adaptively biased power event detection comparator; and a plurality of transistors connected between the current source and the output, configured to increase the bias current for the adaptively biased power event detection comparator from the first level based on the voltage level of the power supply decreasing to be closer to the reference voltage.

In yet another exemplary embodiment, the present disclosure provides a method for operating an adaptive bias circuit for an adaptively biased power event detection comparator. The method includes: receiving, by the adaptive bias circuit, first and second inputs, wherein the first input corresponds to a voltage level of a power supply and the second input corresponds to a reference voltage; and increasing, by the adaptive bias circuit, a bias current for the adaptively biased power event detection comparator based on the voltage level of the power supply decreasing to be closer to the reference voltage.

DETAILED DESCRIPTION

The following detailed description is exemplary in nature and is not intended to limit the disclosure or the application and uses of the disclosure. Furthermore, there is no intention to be bound by any expressed or implied theory presented in the preceding background, summary and brief description of the drawings, or the following detailed description.

Exemplary embodiments of the present disclosure provide an adaptively biased power event detection comparator which is able to detect power events with fast response time and with very low bias point. Exemplary embodiments of the present disclosure further provide systems, devices, circuit configurations, and methods relating thereto. The response time of an adaptively biased power event detection comparator according to exemplary embodiments of the present disclosure is as fast as a bandgap voltage comparator, while the bias point is orders of magnitude lower. This provides for significant power savings during an "always on" idle mode.

Using an adaptive bias circuit, exemplary embodiments of the present disclosure are able to ramp up the bias current for the adaptively biased power event detection comparator under conditions corresponding to the occurrence of a power event. This enables the adaptively biased power event detection comparator to have a fast response time to the occurrence of such power events while maintaining a very low bias current during the steady-state idle mode conditions in which the power supply of the corresponding device is on. Examples of power events include, but are not limited to: (1) a malfunction causing a voltage supplied by a power supply to drop below a safe operational range; (2) the malfunction being resolved causing the supplied voltage to rise back up into the safe operational range; and (3) a power supply being turned on and initialized.

Figure 1:
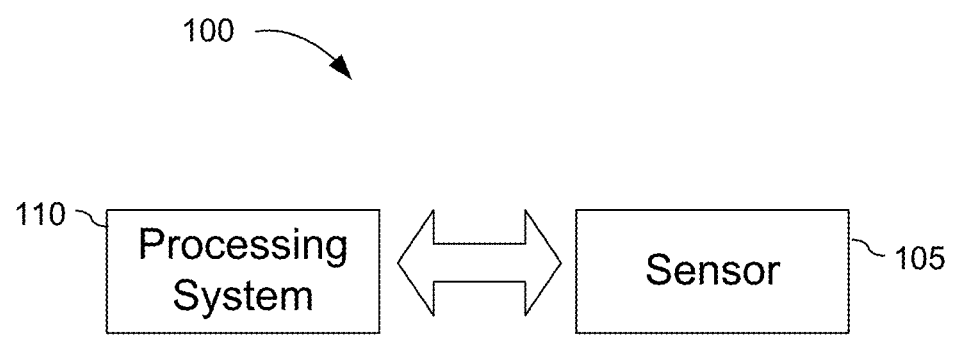
FIG. 1 is a block diagram depicting an exemplary input device.

FIG. 1 is a block diagram depicting an example input device 100 within which the present embodiments may be implemented. The input device 100 may be configured to provide input to an electronic system (not shown for simplicity). As used in this document, the term "electronic system" (or "electronic device") broadly refers to any system capable of electronically processing information. Examples of electronic systems include personal computing devices (e.g., desktop computers, laptop computers, netbook computers, tablets, web browsers, e-book readers, and personal digital assistants (PDAs)), wearable computers (e.g., smart watches and activity tracker devices), composite input devices (e.g., physical keyboards, joysticks, and key switches), data input devices (e.g., remote controls and mice), data output devices (e.g., displays and printers), remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras). Additionally, the electronic system may be a host or a slave to the input device 100.

The input device 100 may be implemented as a physical part of the electronic system, or may be physically separate from the electronic system. The input device 100 may be coupled to (and communicate with) components of the electronic system using wired or wireless interconnections and communication technologies, such as buses and networks. Example technologies may include Inter-Integrated Circuit ($I^2C$), Serial Peripheral Interface (SPI), Personal System/2 (PS/2), Universal Serial Bus (USB), Bluetooth®, Infrared Data Association (IRDA), and various radio frequency (RF) communication protocols defined by the IEEE 802.11 or other standards.

In the example of FIG. 1, input device 100 includes a sensor 105. The sensor 105 comprises one or more sensing elements configured to sense input provided by one or more input objects in a sensing region of the input device 100. Examples of input objects include fingers, styli, and hands. The sensing region may encompass any space above, around, in, and/or proximate to the sensor 105 in which the input device 100 is able to detect user input (e.g., user input provided by one or more input objects). The sizes, shapes, and/or locations of particular sensing regions (e.g., relative to the electronic system) may vary depending on actual implementations. In some embodiments, the sensing region may extend from a surface of the input device 100 in one or more directions into space, for example, until a signal-to-noise ratio (SNR) of the sensors fall below a threshold suitable for accurate object detection. For example, the distance to which this sensing region extends in a particular direction may be on the order of less than a millimeter, millimeters, centimeters, or more, and may vary significantly with the type of sensing technology used and/or the accuracy desired. In some embodiments, the sensor 105 may detect input involving no physical contact with any surfaces of the input device 100, contact with an input surface (e.g., a touch surface and/or screen) of the input device 100, contact with an input surface of the input device 100 coupled with some amount of applied force or pressure, and/or a combination thereof. In various embodiments, input surfaces may be provided by surfaces of sensor substrates within which or on which sensor elements are positioned, or by face sheets or other cover layers positioned over sensor elements.

The input device 100 comprises one or more sensing elements for detecting user input. Some implementations utilize arrays or other regular or irregular patterns of sensing elements to detect the input object. The input device 100 may utilize different combinations of sensor components and sensing technologies to detect user input in the sensing region.

The input device 100 may utilize various sensing technologies to detect user input. Example sensing technologies may include capacitive, elastive, resistive, inductive, magnetic, acoustic, ultrasonic, and optical sensing technologies. In some embodiments, the input device 100 may utilize capacitive sensing technologies to detect user inputs. For example, the sensing region may include one or more capacitive sensing elements (e.g., sensor electrodes) to create an electric field. The input device 100 may detect inputs based on changes in capacitance of the sensor electrodes. For example, an object in contact with (or close proximity to) the electric field may cause changes in the voltage and/or current in the sensor electrodes. Such changes in voltage and/or current may be detected as "signals" indicative of user input.

The sensor elements may be arranged in arrays (regular or irregular patterns) or other configurations to detect inputs. In some implementations, separate sensing elements may be ohmically shorted together to form larger sensor electrodes. Some capacitive sensing implementations may utilize resistive sheets that provide a uniform resistance.

Example capacitive sensing technologies may be based on "self-capacitance" (also referred to as "absolute capacitance") and/or "mutual capacitance" (also referred to as "transcapacitance"). Transcapacitance sensing methods detects changes in the capacitive coupling between sensor electrodes. For example, an input object near the sensor electrodes may alter the electric field between the sensor electrodes, thus changing the measured capacitive coupling of the sensor electrodes. In some embodiments, the input device 100 may implement transcapacitance sensing by detecting the capacitive coupling between one or more transmitter sensor electrodes (also "transmitter electrodes" or "drive electrodes") and one or more receiver sensor electrodes (also "receiver electrodes" or "pickup electrodes"). For example, transmitter sensor electrodes may be modulated relative to a reference voltage to transmit transmitter signals while receiver sensor electrodes may be held at a relatively constant voltage to receive the transmitted signals. The reference voltage may be, for example, a substantially constant voltage or system ground. In some embodiments, transmitter sensor electrodes and receiver sensor electrodes may both be modulated. The signals received by the receiver sensor electrodes may be affected by environmental interference (e.g., from other electromagnetic signals and/or objects in contact with, or in close proximity to, the sensor electrodes). Sensor electrodes may be dedicated transmitters or receivers, or may be configured to both transmit and receive.

In some implementations, the input device 100 is configured to provide images that span one, two, three, or higher dimensional spaces. The input device 100 may have a sensor resolution that varies from embodiment to embodiment depending on factors such as the particular sensing technology involved and/or the scale of information of interest. In some embodiments, the sensor resolution is determined by the physical arrangement of an array of sensing elements, where smaller sensing elements and/or a smaller pitch can be used to define a higher sensor resolution.

The input device 100 may be implemented as a fingerprint sensor having a sensor resolution high enough to capture discriminative features of a fingerprint. In some implementations, the fingerprint sensor has a resolution sufficient to capture minutia (including ridge endings and bifurcations), orientation fields (sometimes referred to as "ridge flows"), and/or ridge skeletons. These are sometimes referred to as level 1 and level 2 features, and in an exemplary embodiment, a resolution of at least 250 pixels per inch (ppi) is capable of reliably capturing these features. In some implementations, the fingerprint sensor has a resolution sufficient to capture higher level features, such as sweat pores or edge contours (i.e., shapes of the edges of individual ridges). These are sometimes referred to as level 3 features, and in an exemplary embodiment, a resolution of at least 750 pixels per inch (ppi) is capable of reliably capturing these higher level features.

In some embodiments, a fingerprint sensor is implemented as a placement sensor (also "area" sensor or "static" sensor) or a swipe sensor (also "slide" sensor or "sweep" sensor). In a placement sensor implementation, the sensor is configured to capture a fingerprint input as the user's finger is held stationary over the sensing region. Typically, the placement sensor includes a two dimensional array of sensing elements capable of capturing a desired area of the fingerprint in a single frame. In a swipe sensor implementation, the sensor is configured to capture a fingerprint input based on relative movement between the user's finger and the sensing region. In some embodiments, the swipe sensor may include a linear array or a thin two-dimensional array of sensing elements configured to capture multiple frames as the user's finger is swiped or moves over the sensing region. The multiple frames may then be reconstructed to form an image of the fingerprint corresponding to the fingerprint input. In some implementations, the sensor is configured to capture both placement and swipe inputs.

In some embodiments, a fingerprint sensor is configured to capture less than a full area of a user's fingerprint in a single user input (referred to herein as a "partial" fingerprint sensor). Typically, the resulting partial area of the fingerprint captured by the partial fingerprint sensor is sufficient for the system to perform fingerprint matching from a single user input of the fingerprint (e.g., a single finger placement or a single finger swipe). Some exemplary imaging areas for partial placement sensors include an imaging area of 100 $mm^2$ or less. In another exemplary embodiment, a partial placement sensor has an imaging area in the range of 20-50 $mm^2$. In some implementations, the partial fingerprint sensor has an input surface that is of the same or substantially the same size as the imaging area.

In FIG. 1, a processing system 110 is included with the input device 100. The processing system 110 may comprise parts of or all of one or more integrated circuits (ICs) and/or other circuitry components. The processing system 110 is coupled to the sensor 105, and is configured to operate hardware of the input device 100 (e.g., sensing hardware of the sensor 105) to detect input in the sensing region.

The processing system 110 may include driver circuitry configured to drive sensing signals with sensing hardware of the input device 100 and/or receiver circuitry configured to receive resulting signals with the sensing hardware. For example, processing system 100 may be configured to drive transmitter signals onto transmitter sensor electrodes of the sensor 105, and/or receive resulting signals detected via receiver sensor electrodes of the sensor 105.

The processing system 110 may include a non-transitory computer-readable medium having processor-executable instructions (such as firmware code, software code, and/or the like) stored thereon. The processing system 110 can be implemented as a physical part of the sensor 105, or can be physically separate from the sensor 105. Also, constituent components of the processing system 110 may be located together, or may be located physically separate from each other. For example, the input device 100 may be a peripheral device coupled to a computing device, and the processing system 110 may comprise software configured to run on a central processing unit of the computing device and one or more ICs (e.g., with associated firmware) separate from the central processing unit. As another example, the input device 100 may be physically integrated in a mobile device, and the processing system 110 may comprise circuits and firmware that are part of a main processor of the mobile device. The processing system 110 may be dedicated to implementing the input device 100, or may perform other functions, such as operating displays, driving haptic actuators, etc.

The processing system 110 may operate the sensing element(s) of the sensor 105 of the input device 100 to produce electrical signals indicative of input (or lack of input) in a sensing region. The processing system 110 may perform any appropriate amount of processing on the electrical signals to translate or generate the information provided to the electronic system. For example, the processing system 110 may digitize analog electrical signals received via the sensor electrodes and/or perform filtering or conditioning on the received signals. In some embodiments, the processing system 110 may subtract or otherwise account for a baseline associated with the sensor electrodes. For example, the baseline may represent a state of the sensor electrode when no user input is detected. Accordingly, the information provided by the processing system 110 to the electronic system may reflect a difference between the signals received from the sensor electrodes and a baseline associated with each sensor electrode. As yet further examples, the processing system 110 may determine positional information, recognize inputs as commands, recognize handwriting, match biometric samples, and the like.

In some embodiments, the input device 100 may include a touch screen interface that at least partially overlaps the sensing region of the input device 100. The display of the touch screen interface may be any suitable type of dynamic display capable of displaying a visual interface to a user, including an inorganic light-emitting diode (LED) display, organic LED (OLED) display, cathode ray tube (CRT), liquid crystal display (LCD), plasma display, electroluminescence (EL) display, or other display technology. The display may be flexible or rigid, and may be flat, curved, or have other geometries. The display may include a glass or plastic substrate for thin-film transistor (TFT) circuitry, which may be used to address display pixels for providing visual information and/or providing other functionality. The display may include a cover lens (sometimes referred to as a "cover glass") disposed above display circuitry and above inner layers of the display module, and the cover lens may also provide an input surface for the input device 100. Examples of cover lens materials include optically clear amorphous solids, such as chemically hardened glass, and optically clear crystalline structures, such as sapphire. The input device 100 and the display may share physical elements. For example, some of the same electrical components may be utilized for both displaying visual information and for input sensing with the input device 100, such as using one or more display electrodes for both display updating and input sensing. As another example, the display may be operated in part or in total by the processing system 110 in communication with the input device 100.

Figure 2:
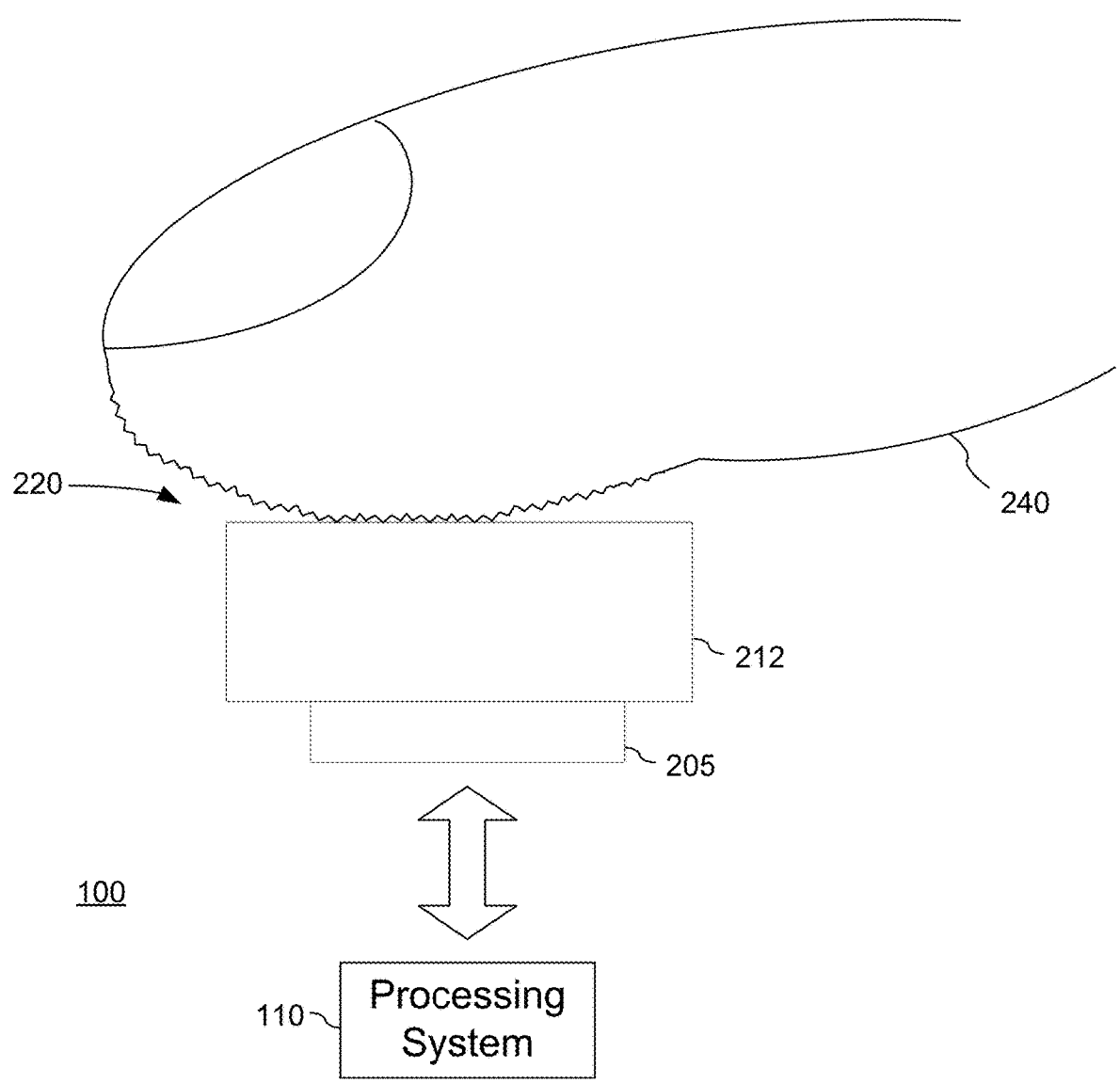
FIG. 2 is a block diagram depicting a further exemplary input device.

FIG. 2 is a block diagram depicting the input device 100 as including a fingerprint sensor 205. The fingerprint sensor 205 is configured to capture an image of the fingerprint from a finger 240. The fingerprint sensor 205 is disposed underneath a cover layer 212 that provides an input surface for the fingerprint to be placed on or swiped over the fingerprint sensor 205. The sensing region 220 may include an input surface with an area larger than, smaller than, or similar in size to a full fingerprint. The fingerprint sensor 205 has an array of sensing elements with a resolution configured to detect surface variations of the finger 240. In certain embodiments, the fingerprint sensor 205 may be disposed within the active area of a display.

Figure 3:
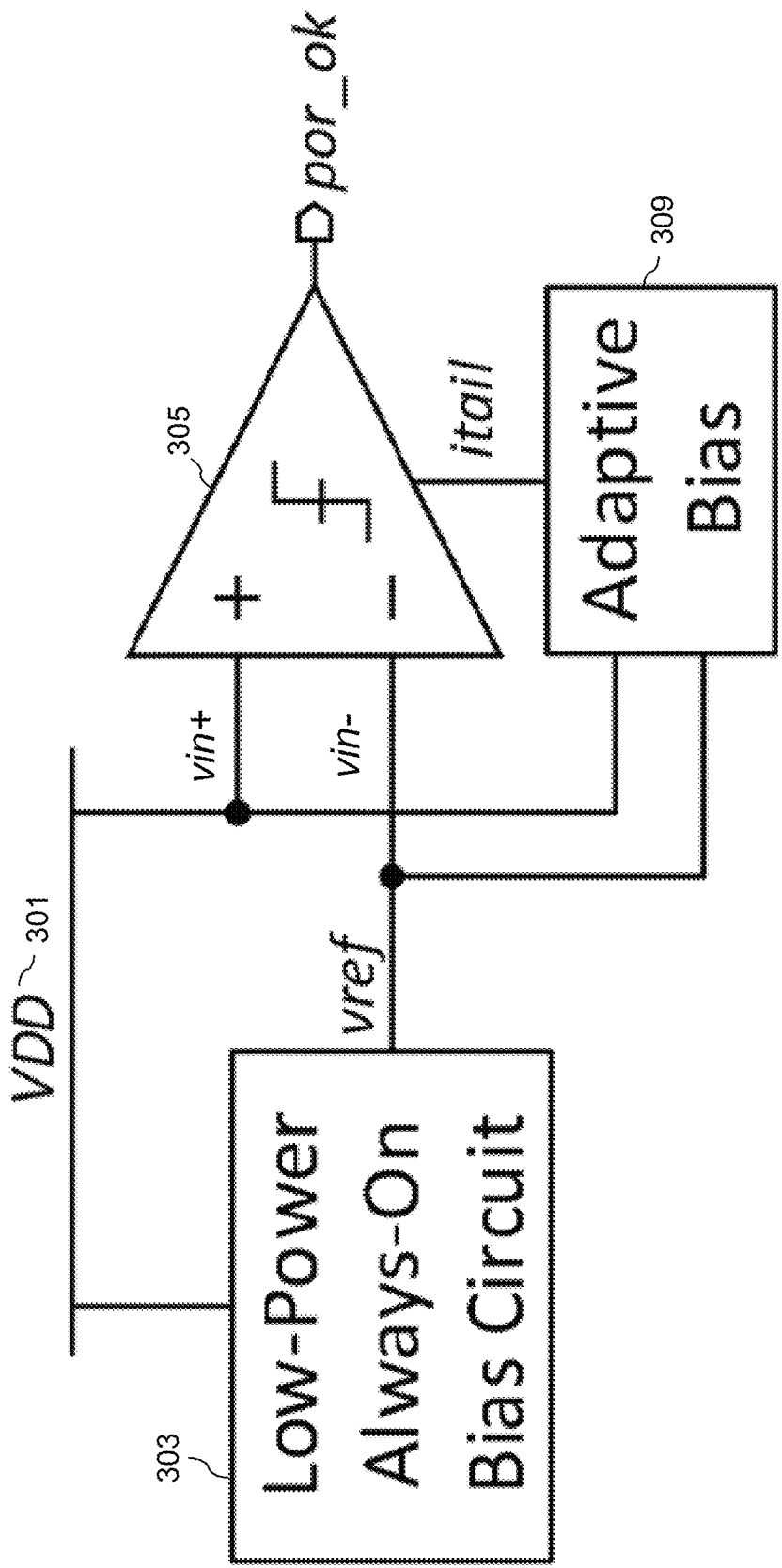
FIG. 3 is a block diagram depicting an exemplary system having an adaptively biased power event detection comparator in accordance with an exemplary embodiment of the disclosure.

FIG. 3 is a block diagram depicting an exemplary system having an adaptively biased power event detection comparator 305 in accordance with an exemplary embodiment of the disclosure. The adaptively biased power event detection comparator 305 may be used, for example, in POR circuits, including POR circuits for input devices as discussed above in connection with FIGS. 1-2. The adaptively biased power event detection comparator 305 has "+" and "−" inputs corresponding to voltages vin+ and vin−, respectively. The adaptively biased power event detection comparator 305 monitors these first and second inputs, and outputs a status signal por_ok. In the configuration shown in FIG. 3, the status signal por_ok is high when the supply voltage 301 (VDD) is greater than a reference voltage vref, wherein the reference voltage vref is output by a low-power always-on bias circuit 303. A high value of status signal por_ok indicates that the power supply is in an operational or "good" state. A low value of status signal por_ok indicates that the power supply is in a problem state or a "bad" state, and the low value of status signal por_ok can be used to trigger an alarm or to trigger a safety mechanism, such as to prevent improper device operation and/or avoid memory corruption.

The low-power always-on bias circuit 303 may be configured to output vref based on a current value of VDD. For example, vref may be configured to be equal to VDD by the low-power always-on bias circuit 303 up to a maximum value of vref, with the maximum value of vref being a fraction of a maximum value of VDD. It will be appreciated, however, that this is not a requirement. In other exemplary implementations, VDD and vref are independent of one another, for example, by being connected to separate power supplies. In this case, vref may be set at a predetermined threshold that is independent of the value of VDD.

The low-power bias circuit 303 may be a current generator. In one exemplary implementation, the low-power bias circuit 303 may be a constant-gm bias circuit operated in weak-inversion which provides a proportional-to-absolute-temperature (PTAT) current in the 10 nA range. The PTAT current may be part of a PTAT cell having stacked PMOS (p-type metal-oxide-semiconductor) and NMOS (n-type metal-oxide-semiconductor) transistors with their gates tied together to generate a vref related to VDD.

In a steady state "always on" idle mode of a corresponding device, while the power supply is in an operational or "good" state, the bias current itail for the adaptively biased power event detection comparator 305 is at a minimum low value, thereby conserving power. The bias current itail is output by adaptive bias circuit 309 based on VDD and vref inputs to the adaptive bias circuit 309. The bias current itail is at the minimum low value (e.g., in the single digit or double digit nanoamp (nA) range) when VDD is significantly higher than vref, as will be discussed in further detail below. Based on the operation of the adaptive bias circuit 309, the bias current itail increases significantly in a situation where VDD decreases to be close to or less than vref, allowing for fast response time. The bias current itail may then decrease back to the low steady state value when VDD returns to being significantly higher than vref. The circuit configuration depicted in FIG. 3 thus provides a very low quiescent current for an "always on" idle mode while maintaining fast response time with respect to detecting power events.

Figure 4:
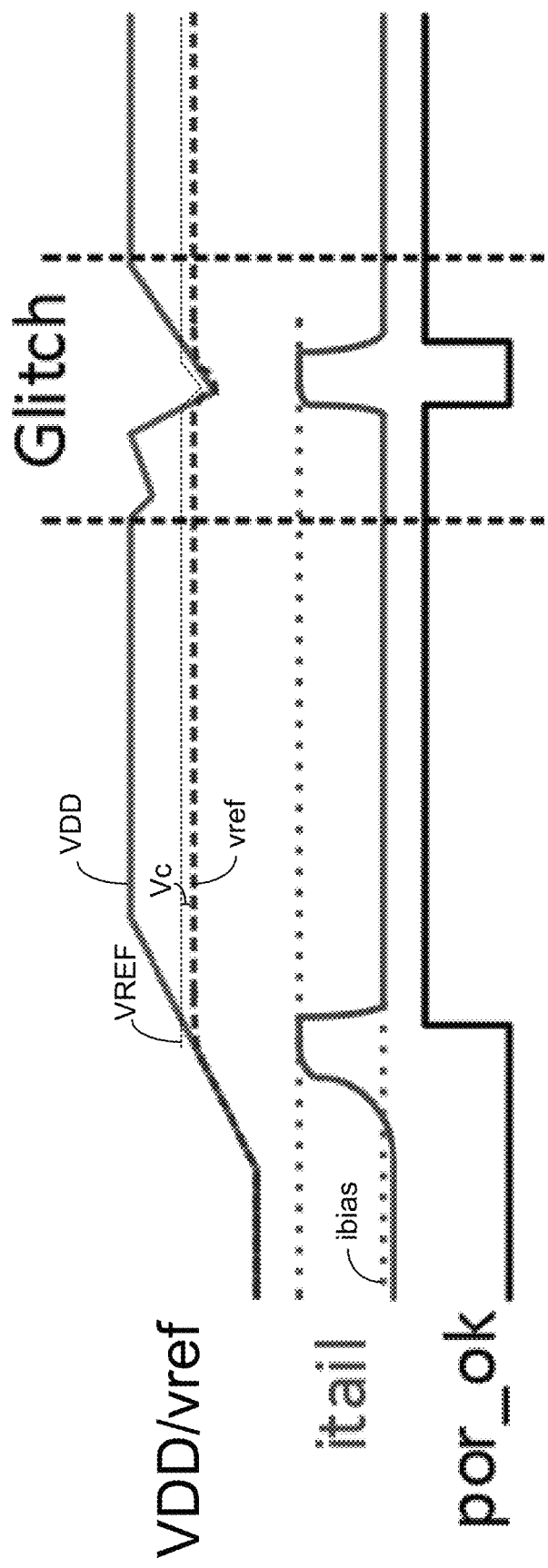
FIG. 4 is an exemplary signal diagram illustrating the operation of an adaptively biased power event detection comparator.

FIG. 4 is an exemplary signal diagram illustrating the simulated operation of an exemplary implementation of an adaptively biased power event detection comparator. In this simulation, the simulated circuit was set up in a slightly different manner than the circuit depicted in FIG. 3. In particular, instead of using vref as the reference voltage and comparing VDD to vref as depicted in FIG. 3, the comparison was made between VDD and a reference voltage VREF, wherein VREF=vref+Vc, with Vc being a constant such that VREF is slightly greater than vref. It will be appreciated that this variation in circuit design for the simulated circuit was merely a design choice for the simulation, and that the operating principles of the simulated circuit are illustrative of the operating principles of the circuit of FIG. 3 with respect to how the bias current for the adaptively biased power event detection comparator is able to be increased at appropriate times. It will be further appreciated that there are many different ways to configure the reference voltage that the power supply voltage is compared to, and the circuit of FIG. 3 and the simulated circuit of FIG. 4 are merely two examples thereof.

With reference to the left side of the signal diagram, a device comprising the adaptively biased power event detection comparator 305 starts out as being in an off state. Upon being turned on, VDD and vref both increase as the power supply is initialized. After vref increases to a predetermined level, vref stops increasing, and VDD continues to increase. The por_ok status signal output by the adaptively biased power event detection comparator transitions from low to high after VDD becomes higher than VREF. Additionally, itail drops to a low level (very close to ibias) during steady-state "always on" idle mode conditions in which VDD is significantly higher than vref. During the occurrence of a glitch, as depicted on the right side of the signal diagram, VDD drops down towards vref, causing a spike upwards in itail. Due to the increased value of itail, the adaptively biased power event detection comparator 305 is able to respond quickly to VDD dropping down below VREF. Thus, after VDD drops down below VREF, the por_ok status signal quickly becomes low. Subsequently, after VDD returns to being greater than VREF, the por_ok status signal quickly returns to high, and after VDD returns to being significantly higher than vref, itail returns to its low steady-state level.

It can be seen that the current itail output by the adaptive bias circuit 309 adaptively biases the adaptively biased power event detection comparator 305 by being increased at appropriate times corresponding to the occurrence of power events, and by being decreased to a low steady-state level (very close to ibias) during "always on" idle mode conditions. As such, when VDD is significantly higher than vref, the amount of power spent biasing the adaptively biased power event detection comparator 305 is minimized. And when VDD is not significantly higher than vref, the amount of power spent biasing the adaptively biased power event detection comparator 305 is temporarily increased such that the adaptively biased power event detection comparator 305 is able to provide a fast response time with respect to the occurrence of a power event.

The simulated circuit corresponding to FIG. 4 was simulated in ideal conditions, and the simulated adaptively biased power event detection comparator was not configured with hysteresis. It will be appreciated, however, that exemplary embodiments of adaptively biased power event detection comparators in accordance with the present disclosure may include hysteresis to prevent oscillations in non-ideal conditions.

Figure 5:
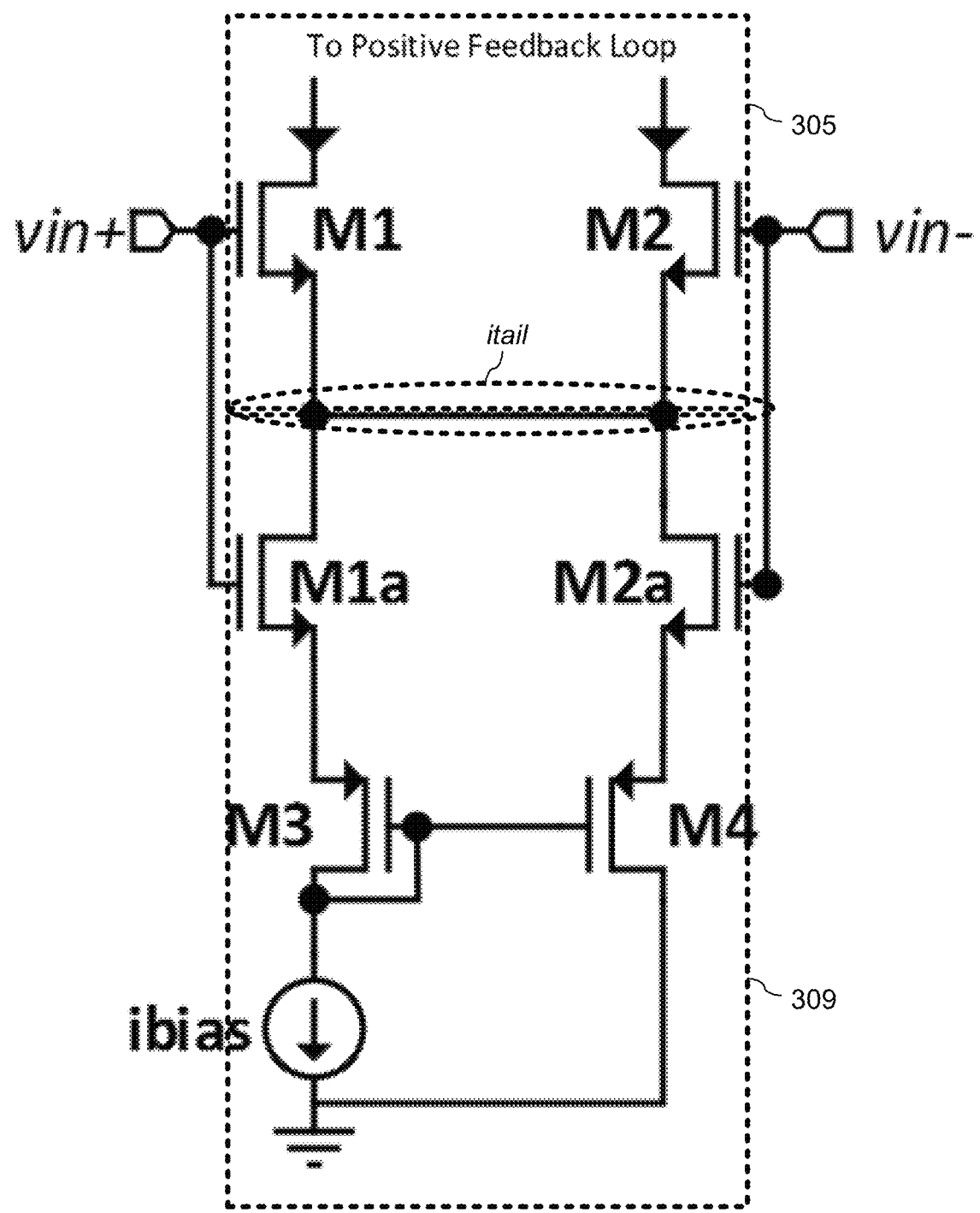
FIG. 5 is a circuit diagram depicting an exemplary adaptive bias circuit in accordance with an exemplary embodiment of the disclosure.

FIG. 5 is a circuit diagram depicting an exemplary adaptive bias circuit 309 in accordance with an exemplary embodiment of the disclosure. For context, part of the adaptively biased power event detection comparator 305 of FIG. 3 is also depicted. The "+" input to the adaptively biased power event detection comparator 305 (vin+), corresponding to VDD in FIG. 3, is input to both the gate of a first transistor M1 of the adaptively biased power event detection comparator 305 and the gate of a first transistor M1a of the adaptive bias circuit 309. The "−" input to the adaptively biased power event detection comparator 305 (vin−), corresponding to vref in FIG. 3, is input to both the gate of a second transistor M2 of the adaptively biased power event detection comparator 305 and the gate of a second transistor M2a of the adaptive bias circuit 309. The drains of M1 and M2 are connected to a positive feedback loop in the adaptively biased power event detection comparator 305. A node corresponding to itail in FIG. 3 is connected to the sources of M1 and M2 and the drains of M1a and M2a. The source of M1a is connected to the source of a third transistor M3 of the adaptive bias circuit 309, and the source of M2a is connected to the source of a fourth transistor M4 of the adaptive bias circuit 309. The gates of M3 and M4 are connected to each other, to the drain of M3 and to a first terminal of a current source of the adaptive bias circuit 309 which generates a current ibias. The second terminal of the current source which generates ibias is connected to the drain of M4 and to a ground of the adaptive bias circuit 309. itail corresponds to the sum of the currents at the sources of M1 and M2, and is the bias current for the adaptively biased power event detection comparator 305.

M1 and M2 correspond to the differential inputs of the adaptively biased power event detection comparator 305, and M1a and M2a may be identical to M1 and M2, respectively. M1a and M2a are configured to steer current in different manners based on the situation. For example, in an "always on" idle mode of a device, VDD may be at a relatively higher positive voltage while vref is at a relatively lower positive voltage. In this situation, the gate voltage on M1a is much larger than the gate voltage on M2a, which causes the ibias current to flow through M3 and a negligible amount of current to flow through M4, resulting in itail being very close to ibias.

In a situation where VDD starts to decrease towards vref, the gate voltage on M1a approaches the gate voltage on M2a. As VDD approaches vref, the bias current itail approaches (N+1)*ibias, where N corresponds to the ratio between the aspect ratio of M4 relative to the aspect ratio of M3. Thus, for example, if M3 and M4 are matched, N=1 and the upper bound of itail is 2*ibias. In the simulations depicted in FIGS. 4 and 6, the M4/M3 ratios were set to be 8, such that the upper bound of itail was approximately 9*ibias. Generally speaking, ibias provides a lower bound for itail, and (N+1)*ibias provides an upper-bound for itail, but it will be appreciated that the maximum value of itail may be different from (N+1)*ibias due to VGS differences between M3 and M4 (which in this example are pMOS devices). It will further be appreciated that the value of ibias may vary depending on implementation and technology. An exemplary range of ibias in accordance with exemplary embodiments of the present disclosure is 1 nA-1 μA. An exemplary range for N in accordance with exemplary embodiments of the present disclosure is 1 to 20.

In a situation where VDD was near, equal to, or below vref, and VDD starts to recover back to its steady state value of being significantly higher than vref, VDD may be rising while vref is staying constant. In this situation, the voltage at the gate of M1a is rising while the voltage at the gate of M2a stays constant. Thus, both M1 and M1a will begin requesting more current until a negligible amount current flows through M2a, and the bias point of the adaptively biased power event detection comparator 305 becomes dictated effectively only by ibias.

It will be appreciated that the circuit structures depicted in FIGS. 3 and 5 are exemplary, and that other circuit structures may be utilized without departing from the principles of the disclosure. For example, it will be appreciated that although M1, M2, M1a, M2a are depicted as nMOS transistors and M3, M4 are depicted as pMOS transistors in the exemplary embodiment of FIG. 5, other configurations may be used in other embodiments. For example, in another exemplary embodiment, M1, M2, M1a, M2a may be pMOS transistors and M3, M4 may be nMOS transistors. To provide another example, it will further be appreciated that although VDD corresponds to the "+" input of the adaptively biased power event detection comparator 305 and vref corresponds to the "−" input of the adaptively biased power event detection comparator 305 in the exemplary embodiment of FIG. 3, other configurations may be used in other embodiments. For example, VDD may be input to the "−" input of the adaptively biased power event detection comparator 305 and vref may be input to the "+" input of the adaptively biased power event detection comparator 305 with appropriate other modifications.

Figure 6:
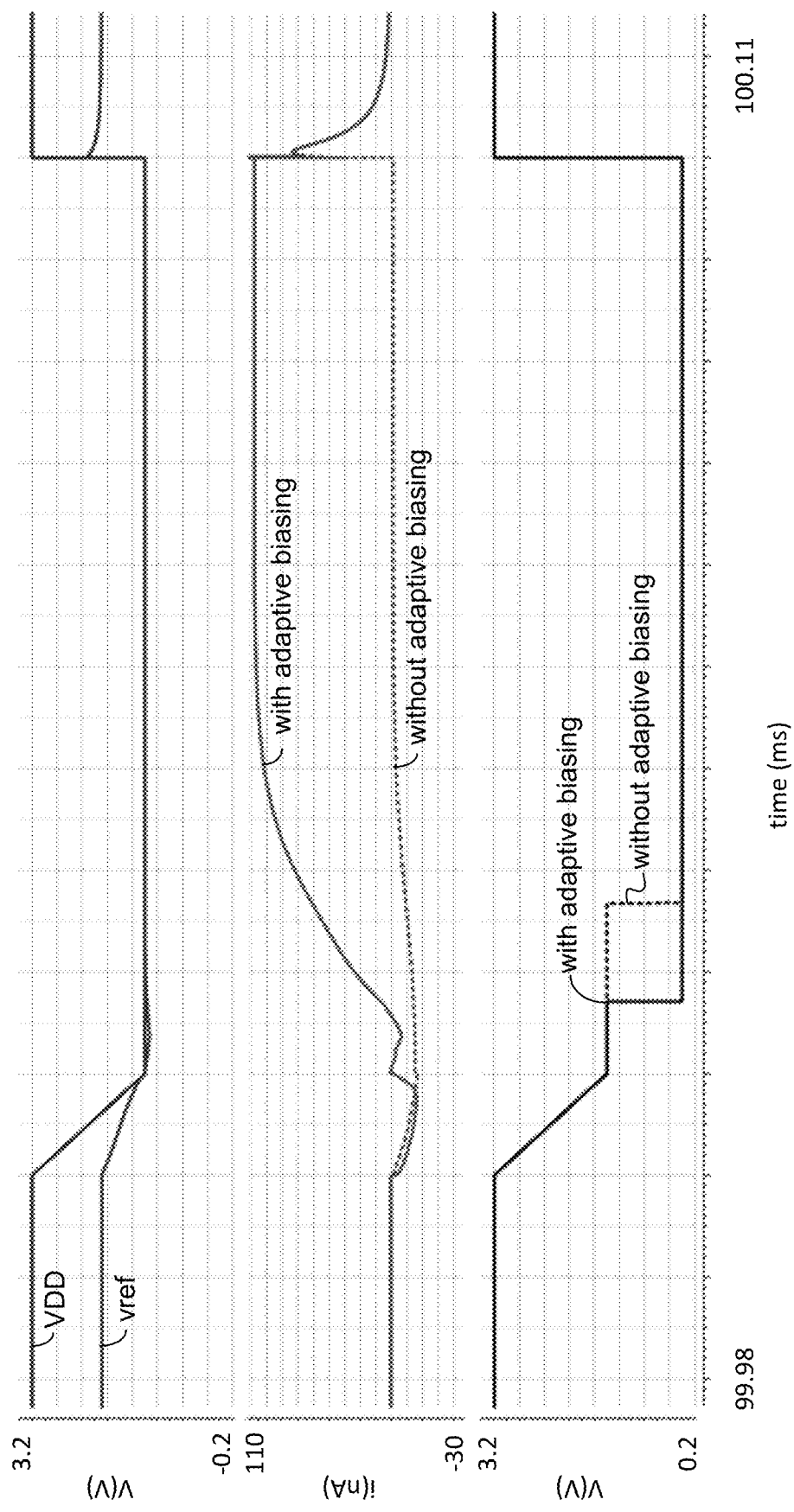
FIG. 6 is an exemplary simulation illustrating the operation of an adaptively biased power event detection comparator relative to a power event detection comparator without adaptive biasing.

FIG. 6 is another exemplary simulation. FIG. 6 illustrates the operation of an adaptively biased power event detection comparator in an exemplary implementation of the disclosure relative to a power event detection comparator without adaptive biasing. The simulation of FIG. 6 is similar to the simulation of FIG. 4 in that the simulated circuit is comparing VDD to VREF, where VREF is the depicted vref value plus a constant Vc. The top part of FIG. 6 contains a plot of the VDD (top line) and vref (bottom line) values over time used to simulate the operation of both types of comparators. The middle part of FIG. 6 contains a plot of corresponding itail values over time for the adaptively biased power event detection comparator (top, solid line) and for the power event detection comparator without adaptive biasing (bottom, dotted line). The bottom part of FIG. 6 contains a plot of corresponding por_ok values over time for the adaptively biased power event detection comparator (solid line) and for the power event detection comparator without adaptive biasing (dotted line). Thus, as can be seen from FIG. 6, the adaptively biased power event detection comparator increases itail in the situation of a power event, allowing for faster response time in the por_ok status signal.

Figure 7:
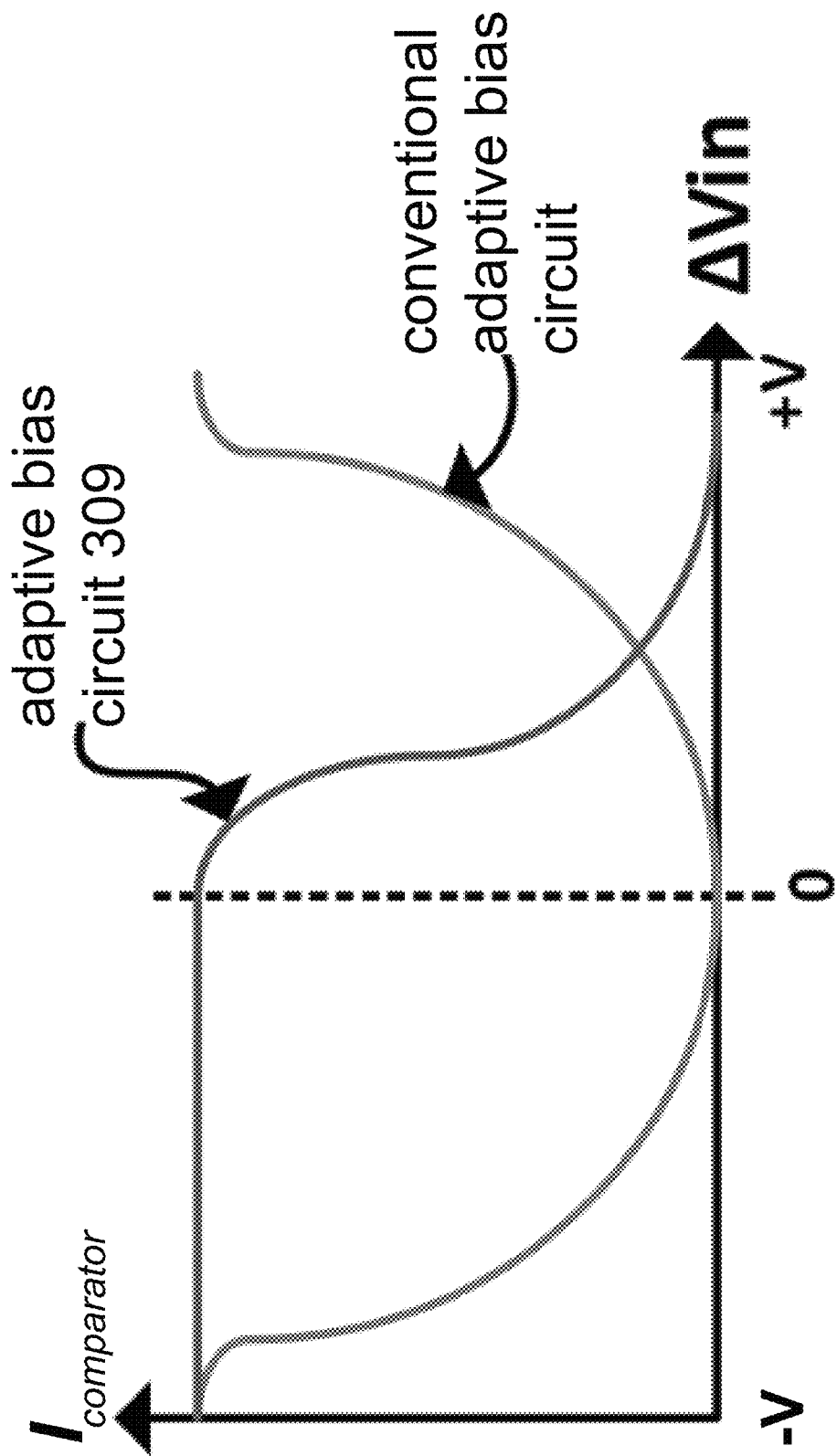
FIG. 7 is an exemplary plot comparing the comparator bias current of a conventional adaptively biased comparator versus an adaptively biased power event detection comparator according to an exemplary embodiment of the present disclosure over a range of voltage differentials between the differential inputs of the respective comparators.

It will be appreciated that adaptively biased comparators already exist, but conventional adaptively biased comparators are different from the adaptively biased power event detection comparators discussed in the present disclosure. A conventional adaptively biased comparator strives to increase the bias current for the comparator when the voltages at the differential inputs of the comparator have a large difference and decrease current as they get closer together. An adaptively biased power event detection comparator according to exemplary embodiments of the present disclosure, however, minimizes the bias current for the comparator when the voltages at the differential inputs of the comparator have a large difference of a certain polarity and increases the bias current for the comparator as the voltage of one differential input of the comparator (VDD) decreases and gets closer to the other differential input of the comparator (vref). The bias current for the adaptively biased power event detection comparator according to exemplary embodiments of the present disclosure then either continues to increase or remains at a maximum current level as VDD becomes less than vref. This is depicted in FIG. 7, which is an exemplary plot comparing the comparator bias current (Icomparator) of a conventional adaptively biased comparator versus an adaptively biased power event detection comparator according to an exemplary embodiment of the present disclosure over a range of voltage differentials (ΔVin) between the differential inputs of the respective comparators.

Figure 8:
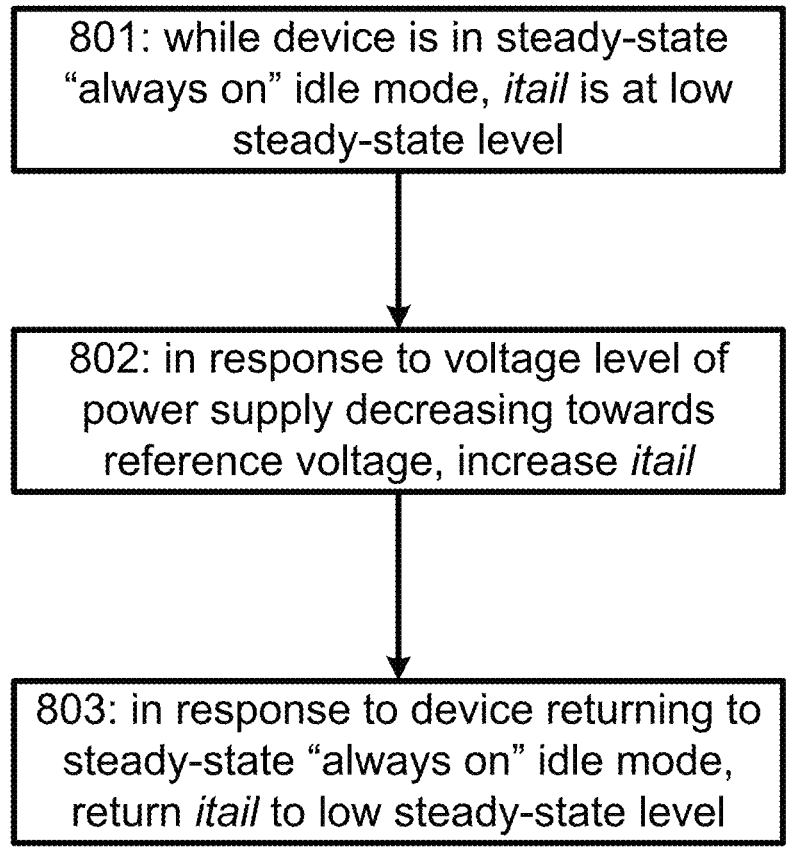
FIG. 8 is an exemplary flow chart illustrating operation of an adaptive bias circuit in an exemplary embodiment of the present disclosure.

FIG. 8 is an exemplary flow chart illustrating operation of an adaptive bias circuit in an exemplary embodiment of the present disclosure. The adaptive bias circuit receives a voltage level of a power supply and a reference voltage as first and second inputs. At stage 801, a device is in a steady-state "always on" idle mode wherein the voltage level of the power supply is significantly greater than the reference voltage, and the adaptive bias circuit outputs a bias current itail at a low steady-state level (e.g., in the range of 1-99 nanoamps such as at a level of 20 nanoamps). At stage 802, in response to the voltage level of the power supply decreasing to be closer to the reference voltage, the adaptive bias circuit increases the bias current itail to allow for faster response time for a status signal output by a corresponding adaptively biased power event detection comparator. At stage 803, in response to the device returning to the steady-state "always on" idle mode wherein the voltage level of the power supply is significantly greater than the reference voltage, the adaptive bias circuit returns to outputting the bias current itail at the low steady-state level.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing exemplary embodiments of the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the exemplary embodiments of the disclosure and does not pose a limitation on the scope of the disclosure unless otherwise claimed. No language in the specification should be construed as indicating any non-claimed element as being essential.

Certain embodiments of this disclosure are described herein. Variations of those embodiments may become apparent to those of ordinary skill in the art upon reading the foregoing description. It is expected that skilled artisans may employ such variations as appropriate, and exemplary embodiments of the disclosure may be practiced otherwise than as specifically described herein. Accordingly, this disclosure contemplates all modifications and equivalents of the subject matter recited in the claims appended hereto as permitted by applicable law. Moreover, any combination of the above-described elements in all possible variations thereof is contemplated by the disclosure unless otherwise indicated herein or otherwise clearly contradicted by context.

The invention claimed is:

1. A system, comprising:
   a power supply;
   an adaptively biased power event detection comparator; and
   an adaptive bias circuit for the adaptively biased power event detection comparator;
   wherein the adaptively biased power event detection comparator is configured to compare a first input corresponding to a voltage level of the power supply with a second input corresponding to a reference voltage;
   wherein the adaptive bias circuit is configured to increase a bias current for the adaptively biased power event detection comparator based on the voltage level of the power supply decreasing to be closer to the reference voltage;
   wherein the adaptive bias circuit comprises a first transistor and a second transistor, wherein the voltage level of the power supply is input to a gate of the first transistor and the reference voltage is input to a gate of the second transistor; and
   wherein the bias current is a sum of a first current across a source and a drain of the first transistor and a second current across a source and a drain of the second transistor.

2. The system according to claim 1, wherein the reference voltage is a function of the voltage level of the power supply.

3. The system according to claim 1, wherein the reference voltage is connected to a second power supply.

4. The system according to claim 1, wherein a maximum value of the bias current is based on a ratio between the aspect ratio of a fourth transistor relative to the aspect ratio of a third transistor.

5. The system according to claim 4, wherein the ratio is in the range of 1 to 20.

6. The system according to claim 1, wherein the adaptive bias circuit is configured to provide the bias current at a minimum level during an idle mode of the system.

7. The system according to claim 6, wherein the minimum level of the bias current is in the range of 1 nA to 1 µA.

8. The system according to claim 1, wherein the system comprises a power-on-reset circuit.

9. An adaptive bias circuit for an adaptively biased power event detection comparator, wherein the adaptive bias circuit comprises:
   a first input corresponding to a voltage level of a power supply;
   a second input corresponding to a reference voltage;
   a current source, configured to generate current at a first level;
   an output configured to provide a bias current for the adaptively biased power event detection comparator; and
   a plurality of transistors connected between the current source and the output, configured to increase the bias current for the adaptively biased power event detection comparator from the first level based on the voltage level of the power supply decreasing to be closer to the reference voltage;
   wherein the plurality of transistors comprises a first transistor and a second transistor, wherein the voltage level of the power supply is input to a gate of the first transistor and the reference voltage is input to a gate of the second transistor; and
   wherein the bias current is a sum of a first current across a source and a drain of the first transistor and a second current across a source and a drain of the second transistor.

10. The adaptive bias circuit according to claim 9, wherein a maximum value of the bias current is based on a ratio between the aspect ratio of a fourth transistor relative to the aspect ratio of a third transistor.

11. The adaptive bias circuit according to claim 10, wherein the ratio is in the range of 1 to 20.

12. The adaptive bias circuit according to claim 9, wherein the adaptive bias circuit is configured to provide the bias current at a minimum level during an idle mode of a system comprising the adaptive bias circuit.

13. The adaptive bias circuit according to claim 12, wherein the minimum level of the bias current is in the range of 1 nA to 1 µA.

14. The adaptive bias circuit according to claim 9, wherein the adaptive bias circuit is part of a power-on-reset circuit.

15. A method for operating an adaptive bias circuit for an adaptively biased power event detection comparator, comprising:
   receiving, by the adaptive bias circuit, first and second inputs, wherein the first input corresponds to a voltage level of a power supply and is received at a gate of a first transistor of the adaptive bias circuit, and wherein the second input corresponds to a reference voltage and is received at a gate of a second transistor of the adaptive bias circuit; and
   increasing, by the adaptive bias circuit, a bias current for the adaptively biased power event detection comparator based on the voltage level of the power supply decreasing to be closer to the reference voltage, wherein the bias current is a sum of a first current across a source and a drain of the first transistor and a second current across a source and a drain of the second transistor.

16. The method according to claim 15, further comprising:
   outputting, by the adaptive bias circuit, the bias current at a minimum level during an idle mode of a system comprising the adaptive bias circuit.

* * * * *